(12) United States Patent
Nam et al.

(10) Patent No.: US 9,036,041 B2
(45) Date of Patent: May 19, 2015

(54) STEPPED RAMP SIGNAL GENERATOR AND IMAGE SENSOR USING THE SAME

(71) Applicant: Dongbu HiTek Co., Ltd., Gyeonggi-do (KR)

(72) Inventors: Jeongkwon Nam, Gyeonggi-do (KR); Haksoo Oh, Gyeonggi-do (KR)

(73) Assignee: Dongbu HiTek Co., Ltd., Gyeonggi-do (KR)

( * ) Notice: Subject to any disclaimer, the term of this patent is extended or adjusted under 35 U.S.C. 154(b) by 189 days.

(21) Appl. No.: 13/768,236

(22) Filed: Feb. 15, 2013

(65) Prior Publication Data

US 2013/0258157 A1 Oct. 3, 2013

(30) Foreign Application Priority Data

Mar. 29, 2012 (KR) .................... 10-2012-0032370

(51) Int. Cl.
*H04N 5/228* (2006.01)
*H04N 5/335* (2011.01)
*H04N 5/225* (2006.01)
*H03K 4/02* (2006.01)

(52) U.S. Cl.
CPC . *H04N 5/225* (2013.01); *H03K 4/02* (2013.01)

(58) Field of Classification Search
USPC .................... 348/222.1, 294, 311; 327/126
See application file for complete search history.

(56) References Cited

U.S. PATENT DOCUMENTS

| 6,909,427 | B2 * | 6/2005 | Janssen et al. ................. 345/204 |
| 7,116,138 | B2 | 10/2006 | Lim |
| 8,093,543 | B2 * | 1/2012 | Yamaoka et al. ......... 250/214 R |
| 2003/0071666 | A1 | 4/2003 | Bailey |
| 2008/0218145 | A1 * | 9/2008 | Xu ................................. 323/288 |
| 2008/0296473 | A1 * | 12/2008 | Yamaoka ..................... 250/205 |
| 2010/0271248 | A1 | 10/2010 | Yamaoka et al. |
| 2011/0114827 | A1 * | 5/2011 | Yamaoka et al. ......... 250/214 R |
| 2012/0001055 | A1 | 1/2012 | Lee |

FOREIGN PATENT DOCUMENTS

| KR | 10-0843194 | 6/2008 |
| KR | 10-2012-0002274 | 10/2012 |
| WO | WO 2009/090703 | 7/2009 |

* cited by examiner

*Primary Examiner* — Trung Diep
(74) *Attorney, Agent, or Firm* — Sherr & Jiang, PLLC

(57) ABSTRACT

A stepped ramp signal generator includes a ramp signal generation unit configured to provide final values of previous stepped ramp signals as initial values of the next stepped ramp signals. The ramp signal generation unit includes a plurality of matching resistors, and a plurality of holders installed between the matching resistors, each holder storing a final value across a previous matching resistor and providing the final value to a next matching resistor.

11 Claims, 5 Drawing Sheets

STEPPED RAMP SIGNAL GENERATOR AND IMAGE SENSOR USING THE SAME

The present application claims priority under 35 U.S.C. 119 and 35 U.S.C. 365 to Korean Patent Application No. 10-2012-0032370 (filed on Mar. 29, 2012), which is hereby incorporated by reference in its entirety.

BACKGROUND

Image sensors convert light signals into electrical signals (e.g. analog signals). In some circumstances, it may be necessary to convert an analog signal into a digital signal, in order to perform several-stepped image processing procedures for providing an image signal to a display device (e.g. a liquid crystal display or similar devices). Often, an analog-to-digital converter (hereinafter referred to as an ADC) may be used.

In general, the more bits that are output from the ADC, the higher the resolution of the ADC. Accordingly, when a relatively finely divided analog signal is input into the ADC, it may be desirable for the ADC to output a relatively high data digital signal. An ADC may include a flash ADC, an integration ADC, a staircase ADC, a tracking ADC, and/or similar devices.

An integration ADC may be adapted to precisely convert analog signals into digital signals. The integration ADC may be configured with an integrator, a comparator, and/or a counter. An integration ADC may count clock pulses during a time duration proportional to the voltage of an input analog signal and output the count as a digital signal. The duration proportional to the voltage of the input analog signal may be obtained using the integrator. A reference voltage and a ramp voltage generated in a ramp voltage generator may be applied to the comparator, and the counter may latch the count at an instant when the ramp voltage exceeds the reference voltage. The latched count may be provided as a digital value. The ramp voltage generator may include a single slope integrator configured with capacitors and resistors.

FIG. 1 is a graph illustrating outputs of an ADC including a single slope integrator, in accordance with the related art. A vertical axis denotes the output of a single slope ADC including a single slope integrator and a horizontal axis denotes an input voltage to the ADC. The single slope ADC may not cause any problems when processing a small number of pixels. However, as the number of pixels becomes larger, the single slope ADC may need higher processing speeds. A two-step slope ADC may be used instead of the single slope ADC. However, the two-step slope ADC requires a two-step ramp signal generator configured to generate at least two stepped ramp signals in order to convert an analog signal into a digital signal.

FIG. 2 illustrates a waveform diagram of ramp signals with a two-step slope, in accordance with the related art. In a two-step slope ADC, a maximum value of a first stepped ramp signal Vramp(n−1) may often be different from an initial value of a second stepped ramp signal Vramp(n). Therefore, when the ADC produces a digital signal, code errors corresponding to the digital signal may occur (e.g. a missing code may be generated).

SUMMARY

Embodiments relate to a stepped ramp signal generator which is adapted to substantially prevent and/or minimize the generation of missing codes due to discordance between steps of the stepped ramp signals. Embodiments relate to an image sensor including the step ramp signal generator.

In embodiments, a stepped ramp signal generator includes a ramp signal generation unit configured to provide final values of previous stepped ramp signals as initial values of the next stepped ramp signals. In embodiments, the ramp signal generation unit includes at least one of: (1) a plurality of matching resistors; and/or (2) a plurality of holders installed between the matching resistors, with each holder storing a final value induced by a previous matching resistor and providing the final value to a next matching resistor.

In embodiments, the holder includes at least one of: (1) a capacitive element that stores the final value across the previous matching resistor; (2) a switching element configured to perform an switching operation to allow the final value across the previous matching resistor to store in the capacitive element; and/or (3) a buffer configured to provide the final value stored in the capacitive element to the next matching resistor. In embodiments, the stepped ramp signal generator includes a counter configured to generate a first signal which is used to generate first stepped ramp signals, and a second signal which is used to generate second stepped ramp signals. In embodiments, the stepped ramp signal generator further includes a current mirror configured to apply an identical current to the matching resistors of the ramp signal generation unit in response to the first and second signals.

In embodiments, an image sensor includes at least one of: (1) an active pixel sensor array configured to sense light to generate an image signal; (2) a ramp signal generator configured to generate K first stepped ramp signals and K second stepped ramp signals in such a manner as to provide a final value of a (j−1)-th first stepped ramp signal as an initial value of a j-th stepped ramp signal, wherein j is a natural number being larger than 1; and/or (3) an analog-to-digital converter configured to perform a correlated-double-sampling on the image signal to convert the image signal into a digital signal using the stepped ramp signals.

In embodiments the ramp signal generator includes at least one of: (1) a counter configured to generate a first signal which is used to generate the first stepped ramp signals, and a second signal which is used to generate the second stepped ramp signals; and/or (2) a ramp signal generation unit including a plurality of matching resistors, the ramp signal generation unit configured to store a final value across a previous matching resistor in response to the first signal and provide the stored final value to a next matching resistor to derive the first stepped ramp signal from the next matching resistor, and configured to provide the stored final value as an initial value of the second stepped ramp signal in response to the second signal.

In embodiments, the ramp signal generation unit comprises a plurality of holders installed between the matching resistors, each holder storing the final value across the previous matching resistor and providing the final value to the next matching resistor. In embodiments, the holder includes at least one of: (1) a capacitive element that stores the final value across the previous matching resistor; (2) a switching element configured to perform an switching operation to allow the final value across the previous matching resistor to store in the capacitive element; and/or (3) a buffer configured to provide the final value stored in the capacitive element to the next matching resistor.

In embodiments, the ramp signal generation unit includes four matching resistors and/or the counter comprises an 8-bit current counter. In embodiments, the ramp signal generator includes a current mirror configured to provide an identical current to the respective matching resistors of the ramp signal generation unit in response to the first and second signals.

DRAWINGS

The above and other objects and features of embodiments will become apparent from the following description of embodiments, given in conjunction with the accompanying drawings, in which.

DESCRIPTION

Figure 1:
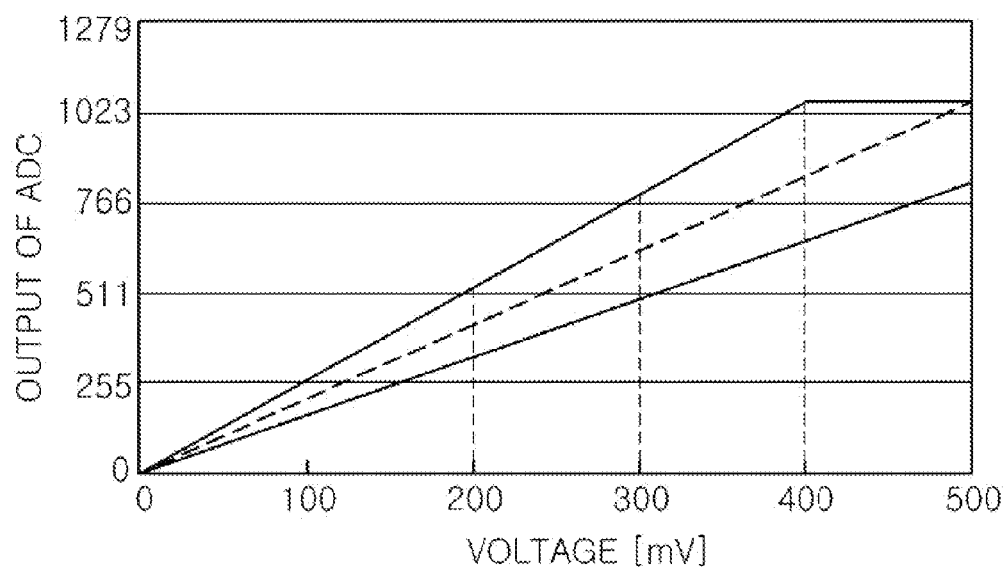
FIG. 1 illustrates a graph of output signals of an ADC including a single slope integrator, in accordance with the related art.
Figure 2:
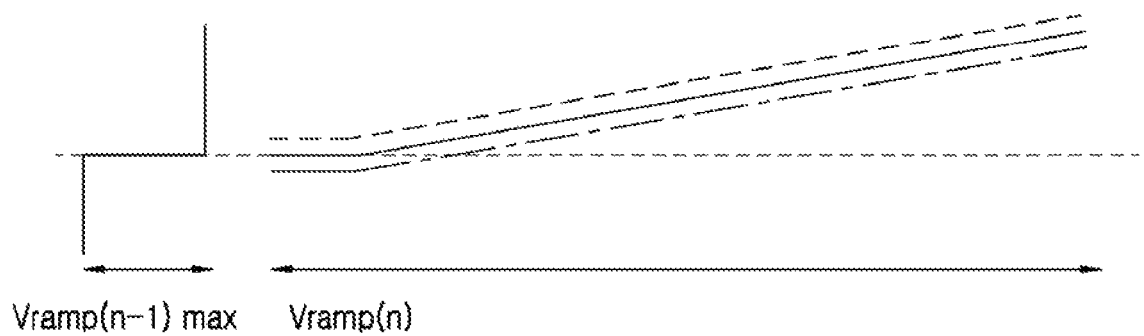
FIG. 2 illustrates a waveform diagram of ramp signals with a two-step slope, in accordance with the related art.

The advantages and features of embodiments and methods of accomplishing these will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims. The accompanying figures in which like reference numerals refer to identical or functionally similar elements throughout the separate views.

Embodiments relate to a ramp signal generator adapted to generate stepped ramp signals in such a manner as to allow a maximum value of a previously stepped ramp signal to be used as an initial value of a next stepped ramp signal. Embodiments relate to a CMOS image sensor including a ramp signal generator adapted to generate stepped ramp signals in such a manner as to allow a maximum value of a previously stepped ramp signal to be used as an initial value of a next stepped ramp signal. Embodiments relate to a ramp signal generator which is adapted to generate a two-step ramp signal and an image sensor employing the same.

Figure 3:
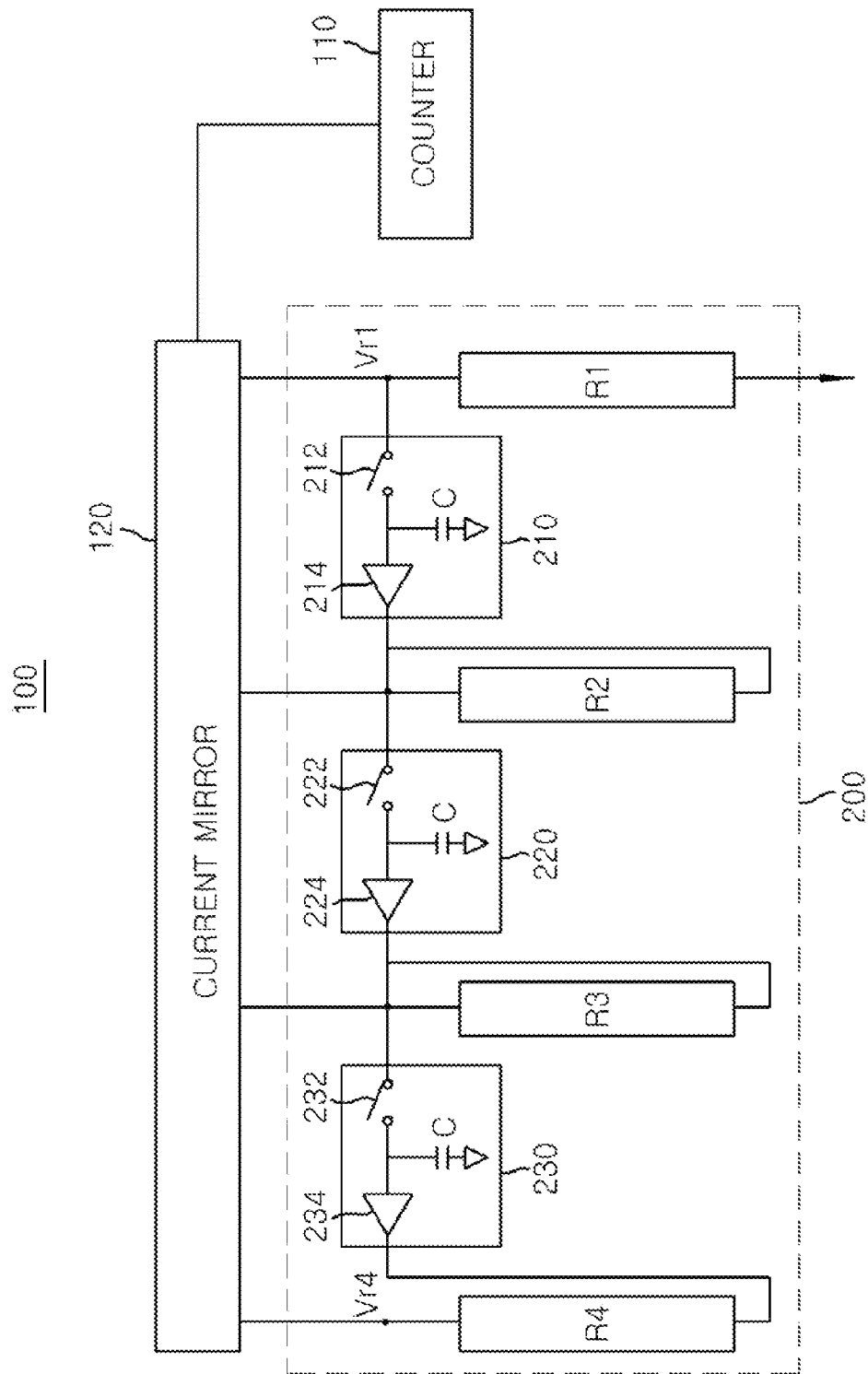
FIG. 3 illustrates a circuit diagram of a ramp signal generator of a two-step slope type, in accordance with embodiments.

Example FIG. 3 illustrates a circuit diagram of a ramp signal generator of a two-step slope type, in accordance with embodiments. The ramp signal generator 100 includes a counter 110, a current mirror 120 and a ramp signal generation unit 200. The ramp signal generator 100 may generate at least two stepped ramp signals by inputting a final value (e.g. a maximum voltage value) of a previously stepped ramp signal as an initial value of another stepped ramp signal.

The ramp signal generator 100 may generate K number of a first stepped ramp signal and a second stepped ramp signal. In embodiments, the ramp signal generator 100 may generate K number of a first stepped ramp signal and a second stepped ramp signal, where the final value of a (j−1)-th stepped ramp signal is provided as an initial value of a j-th stepped ramp signal. The number "j" is a natural number which is more than '1'. For example, in embodiments, the ramp signal generator 100 may generate a ramp signal with the two-step slope in which the final value (e.g. the maximum voltage value) of the first stepped ramp signal may be used as an initial value of the second stepped ramp signal The counter 110 may provide digital signals which will be used to generate the two-step ramp signals for converting an analog signal into a digital signal. In embodiments, the counter 110 may generate a first signal which is used to generate the first stepped ramp signals and $2^n$ signals which are used to generate the second stepped ramp signals. In embodiments, the counter 110 may include an n-bit current counter. The counter 110 may output a bit combination (the first signal) with a maximum value to the current mirror 120 in order to organize the first stepped ramp signal of the two-step ramp signal. For example, in embodiments, if the counter 110 is an 8-bit counter, a bit stream of '11111111' may be applied to the current mirror 120.

In embodiments, after the first stepped ramp signal is organized, the counter 110 may output the $2^n$ signals in order to generate the second stepped ramp signal of the two-step ramp signal, where the final value of the first stepped ramp signal may be employed as an initial value of the second stepped ramp signal. In embodiments, the first stepped ramp signal represents a ramp slope corresponding to most significant bits (MSBs) interval and the second stepped ramp signal represents a ramp slope corresponding to least significant bits (LSBs).

The ramp signal generation unit 200 may include a plurality of (e.g. K number of) matching resistors, for example four (4) matching resistors R1, R2, R3, and R4, in accordance with embodiments. The four matching resistors R1, R2, R3 and R4 may be arranged such that one end of a first matching resistor R1 is connected to a ground, one end of a second matching resistor R2 is connected to the other end of the first matching resistor R1, one end of a third matching resistor R3 is connected to the other end of the second resistor R2, and one end of a fourth matching resistor R4 is connected to the other end of the third matching resistor R3. In this arrangement (in accordance with embodiments), responsive to a first signal: (1) a final value or maximum voltage across the first matching resistor R1 is stored and applied to the one end of the second matching resistor R2; (2) a maximum voltage across the second matching resistor R2 is stored and applied to the one end of the third matching resistor R3; and (3) a maximum voltage across the third matching resistor R3 is stored and applied to the one end of the fourth matching resistor R4.

Therefore, in embodiments, the voltage across the first matching resistor R1 is applied to the second matching resistor R2, the voltage across the second matching resistor R2 is applied to the third matching resistor R3, and the voltage across the third matching resistor R3 is applied to the fourth matching resistor R4. The matching resistors R1, R2, R3 and R4 in the ramp signal generation unit 200 may generate four first stepped ramp signals corresponding to MSB intervals, respectively, when a first signal is generated, in accordance with embodiments. Also, in embodiments, the matching resistors R1, R2, R3 and R4 may generate four second stepped ramp signals corresponding to LSB intervals, respectively, when a second signal is generated.

In embodiments, an initial value of the second stepped ramp signal output from the second matching resistor R2 may become the maximum voltage across the previous matching resistor (e.g. the first matching resistor R1). In embodiments, an initial value of the second stepped ramp signal output from the third matching resistor R3 may become the maximum voltage across the second matching resistor R2. In embodiments, the ramp signal generation unit 200 may include first, second and third holders 210, 220 and 230 configured to temporarily store the final values across the first to third matching resistors R1, R2 and R3, respectively.

The first holder 210 may be connected between the other end of the first matching resistor R1 and the one end of the second matching resistor R2. The second holder 220 may be connected between the other end of the second matching resistor R2 and the one end of the third matching resistor R3. The third holder 230 may be connected between the other end of the third matching resistor R3 and the one end of the fourth matching resistor R4. Each of the first, the second and the third holders 210, 220 and 230 may store the maximum voltage across its previous matching resistor, and may apply the stored voltage to its next matching resistor when the first signal is generated. The second, third and fourth matching resistors R2, R3 and R4 generate the second stepped ramp signals whose initial values become the maximum voltages, which are stored in the first, second and third holders 210, 220 and 230, respectively.

The first, second and third holders 210, 220 and 230 may have substantially an identical configuration. The first, second and third holders 210, 220 and 230 may be configured with capacitive elements Cs, switching elements 212, 222 and 232, and buffers 214, 224 and 234, respectively. Each capacitive element C may be used to store the final value or maximum voltage across the previous matching resistor. Each of the switching elements 212, 222 and 232 may perform a switching operation to selectively provide the maximum voltage across the previous matching resistor, to the next matching resistor or the capacitive element C for the storage thereof. Each of the buffer 214, 224 and 234 may buffer the maximum voltage, stored in the capacitive element C, and may apply the buffered voltage to the next matching resistor. The capacitive element may include, for example, a capacitor.

Figure 4:
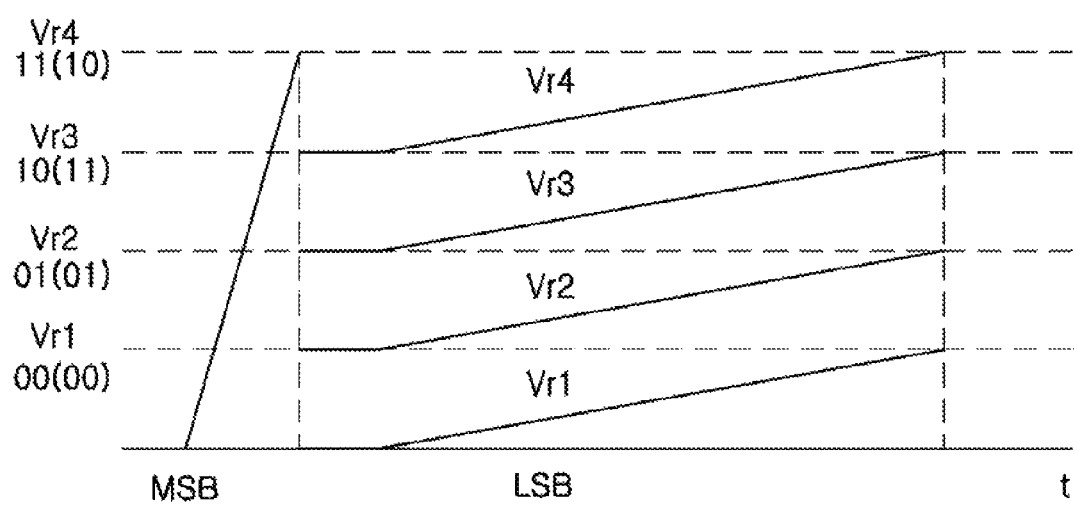
FIG. 4 illustrates a waveform diagram of two-step ramp signals, in accordance with embodiments.

Referring now to FIG. 4, in accordance with embodiments, a voltage Vr1 across the first matching resistor R1 may be stored in the first holder 210. The maximum value of the voltage Vr1 stored in the first holder 210 may be applied to the one end of the second matching resistor R2. Therefore, the voltage Vr2 may induce at the second matching resistor R2 to become the sum of a voltage across the second matching resistor R2 and the maximum value of the voltage Vr1 at the first matching resistor R1. The voltage Vr2 may induce at the second matching resistor R2 voltage stored in the second holder 220 and then may then applied it to the one end of the third matching resistor R3.

In embodiments, during the duration of a turn-on of the switching element 212 of the first holder 210, the voltage Vr1 across the first matching resistor R1 may not only be applied to a positive (+) input terminal of the buffer 214, but may also be charged in the capacitive element C of the first holder 210. The maximum value of the voltage Vr1 stored in the capacitive element C may be applied to the second matching resistor R2 through the buffer 214.

During the duration of turn-on of the switching element 222 of the second holder 220, the voltage Vr2 across the second matching resistor R2 may not only be applied to a positive input terminal of the buffer 224, but also charged in the capacitive element C of the second holder 220. In embodiments, the voltage Vr2 stored in the capacitive element C of the second holder 220 may become the sum of the maximum value of the voltage Vr1 from the first holder 210 and the voltage across the second matching resistor R2. The maximum value of the voltage Vr2 stored in the capacitive element C of the second holder 220 may be applied to the third matching resistor R3 through the buffer 224.

In embodiments, the maximum voltages corresponding to the final values of the first stepped ramp signals are stored in the first, second and third holders 210, 220 and 230 connected to the first, second and third matching resistors R1, R2 and R3 of the ramp signal generation unit 200, respectively. In embodiments, the current mirror 120 serves to apply a substantially identical current to the respective matching resistors R1, R2, R3 and R4 of the ramp signal generation unit 200 in response to the first and second signals. In embodiments, the current mirror 120, in response to the signals generated in the counter 110, applies the substantially identical current (e.g. a current of 0.25 mA) to the respective matching resistors R1, R2, R3 and R4 within the ramp signal generation unit 200.

In embodiments, when the ramp signal generation unit 200 including the four matching resistors is employed, a most significant bit interval may be configured with 2-bit and a least significant bit interval may be configured with 8-bit. In embodiments, the current counter may be implemented with an 8-bit counter. In embodiments, as shown in example FIG. 4, the first matching resistor R1 generates the first step ramp signal which has a first slope corresponding to a 2-bit value of 00. The second matching resistor R2 may generate the first stepped ramp signal which has a second slope corresponding to a 2-bit value of 01. The third matching resistor R3 may generate the first stepped ramp signal which has a third slope corresponding to a 2-bit value of 10 or 11. The fourth matching resistor R4 may generate the first stepped ramp signal which has a fourth slope corresponding to a 2-bit value of 11 or 10. The first stepped ramp signal of the first slope may have a final value of Vr1. The first stepped ramp signal of the second slope may have a final value of Vr2. The first stepped ramp signal of the third slope may have a final value of Vr3. The first stepped ramp signal of the fourth slope may have a final value of Vr4.

In embodiments, the substantially identical current may be applied from the current mirror 120 to the respective first to fourth matching resistors R1 to R4 in accordance with the $2^n$ signals that are sequentially generated from the counter 110. Four second stepped ramp signals may then generated by the first to fourth matching resistors R1 to R4, in accordance with embodiments. In embodiments, since the first matching resistor R1 is connected to the ground, it may generate the second stepped ramp signal having a slope ranging from a voltage of 0V to the maximum voltage of Vr1. Since the one end of the second matching resistor R2 is connected to the first holder 210 in which the voltage across the first matching resistor R1 is stored, the second matching resistor R2 may generate the second stepped ramp signal having a slope ranging from the maximum value of Vr1 across the first matching resistor R1 as an initial value to the maximum voltage of Vr2 across the second matching resistor R2. Since one end of the third matching resistor R3 is connected to the second holder 220 in which the voltage across the second matching resistor R2 is stored, the third matching resistor R3 may generate the second stepped ramp signal having a slope ranging from the maximum voltage of Vr2 as an initial value to the maximum voltage of Vr3 across the third matching resistor R3. Since the one end of the fourth matching resistor R4 is connected to the third holder 230 in which the voltage across the third matching resistor R3 is stored, the fourth matching resistor R4 may generate the second stepped ramp signal having a slope ranging from the maximum voltage of Vr3 as an initial value to the maximum voltage of Vr4 across the fourth matching resistor R4.

Figure 5:
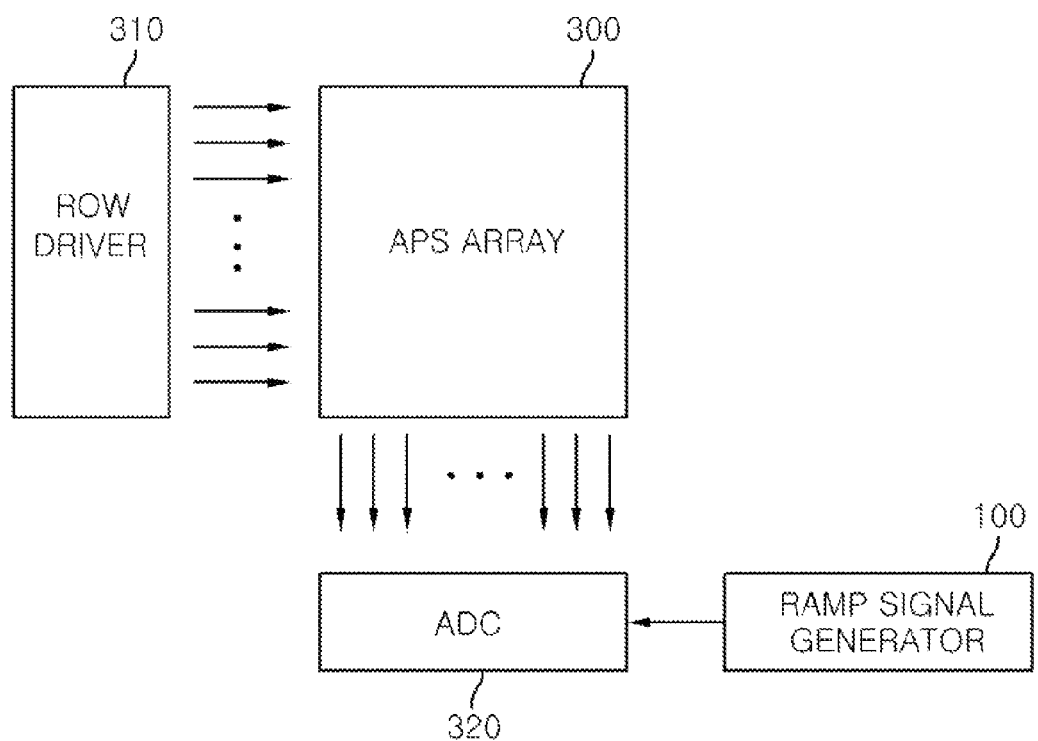
FIG. 5 illustrates a block diagram of a CMOS image sensor employing the ramp signal generator shown in FIG. 3, in accordance with embodiments.

In embodiments, the n-th maximum voltage across the n-th matching resistor Rn is set to the initial value of the second stepped ramp signal which is generated from the (n+1)-th matching resistor Rn+1, and therefore, a missing code due to discordance between steps may be prevented from being generated. Although it has been described and illustrated that the ramp signal generation unit 200 is configured with four matching resistors R1, R2, R3 and R4 in embodiments by way of example, it is understood that the embodiments are not limited thereto. Embodiments relate to a process of converting an analog signal into a digital signal within a CMOS image sensor having the stepped ramp signal generator 100. FIG. 5 illustrates a block diagram of a CMOS image sensor, in accordance with embodiments. In embodiments, the CMOS image sensor may include at least one of: (1) an active pixel sensor (hereinafter, APS) array 300, (2) a row driver 310, (3) an analog-to-digital converter (hereinafter, "ADC") 320, and/or (4) a ramp signal generator 100. The APS array 300 may include an array of photo sensors, such as photo diodes or pinned photo diodes. The APS array 300 may sense light using the photo sensors and converts the sensed light into an electrical signal to produce an image signal.

The row driver 310 may drive the photo sensors in the APS array 300 on a row by row basis (e.g. by generating successive row select signals). The APS array outputs a reset signal and an image signal from each row of the APS array, which has been selected by a corresponding row select signal provided from the row driver 310, and provide the reset and image signals to the ADC 320.

The ADC 320 may convert the image signal provided from the APS array 300 into a digital signal using the first and second stepped ramp signals provided from the ramp signal generator 100, in accordance with embodiments. For example, in embodiments, the ADC 320 may perform a correlated-double sampling on the reset image signals using the first and second stepped ramp signals to generate the digital signal.

Example FIG. 4 illustrated the operation of the ADC 320 for generating the digital signal using the first and second stepped ramp signals provided from the ramp signal generator 100, in accordance with embodiments. First, in embodiments, the most significant bit interval may be selected on the basis of the output voltage from the APS array 300. In embodiments, any one of the matching resistors R1, R2, R3 and R4 may be selected on the basis of the output voltage from the APS array 300, and the most significant bit interval and the least significant bit interval may be selected using the second stepped ramp signal from the selected matching resistor and the output voltage from the APS array 300, whereby the digital signal is obtained. For example, in embodiments, if a voltage of 0.3 mV is output from the APS array 300, the first stepped ramp signal, which is generated from the second matching resistor R2, may be selected, and therefore, a value of the most significant bit interval may become '01' as shown in FIG. 4. In embodiments, a value of the least significant bit interval may be determined by selecting an binary value at a point corresponding to the 0.3 mV in the second stepped ramp signal, which may be generated from the second matching resistor R2, having the maximum voltage of Vr1 stored in the capacitive element C of the first holder 210 connected to the first matching resistor R1 as an initial value. The value of the least significant bit interval may correspond to a signal (a digital value) output from the counter 110 when the voltage of 0.3 mV is output from the second matching resistor R2. The values of the most and least significant bit intervals obtained through the above-mentioned processes may be output as a digital signal.

In embodiments, the first stepped ramp signals may be generated in such a manner that the voltages across the previous matching resistors are stored in the holders and the stored voltages are provided to the next matching resistors. The second stepped ramp signals may be generated from the next matching resistors in such a manner that the voltages stored in the holders are provided as initial values of the second stepped ramp signals, thereby generating the ramp signals having two-step slopes. Accordingly, in embodiments, when the two-step ramp signals are generated, a missing code due to the discordance between the first and second stepped signals may be prevented from being generated.

While embodiments have been shown and described, it will be understood by those skilled in the art that various changes and modification may be made without departing the scope of the embodiments as defined the following claims.

What is claimed is:

1. An apparatus comprising a stepped ramp signal generator, wherein the stepped ramp signal generator comprises:
   a ramp signal generation unit configured to provide final values of a first stepped ramp signals as initial values of a second stepped ramp signals, wherein the second stepped ramp signals are subsequent to the first stepped ramp signals, and wherein the ramp signal generation unit comprises:
   a plurality of matching resistors, comprising a first matching resistor and a second matching resistor; and
   a plurality of holders between the matching resistors, comprising a first holder, wherein the first holder is configured to store a final voltage value across the first matching resistor and provide the final value of the first matching resistor to the second matching resistor.

2. The apparatus of claim 1, wherein:
   the plurality of matching resistors comprises a third marching resistor;
   the plurality of holders comprises a second holder; and
   the second holder is configured to store a final voltage value across the second matching resistor and provide the final voltage value across the second matching resistor to the third matching resistor.

3. The apparatus of claim 1, wherein the holder comprises:
   a capacitive element configured to store the final voltage value across the first matching resistor;
   a switching element configured to perform an switching operation to allow the final voltage value across the first matching resistor to be stored in the capacitive element; and
   a buffer configured to provide the final voltage value stored in the capacitive element to the next matching resistor.

4. The apparatus of claim 1, comprising a counter configured to generate a first counter signal which is used to generate the first stepped ramp signals and a second counter signal which is used to generate the second stepped ramp signals.

5. The apparatus of claim 4, comprising a current mirror configured to apply a substantially identical current to the matching resistors of the ramp signal generation unit in response to the first counter signal and the second counter signal.

6. An apparatus comprising an image sensor, wherein the image sensor comprises:
   an active pixel sensor array configured to sense light to generate an image signal;
   a ramp signal generator configured to generate K first stepped ramp signals and K second stepped ramp signals to provide a final value of a (j−1)-th first stepped ramp signal as an initial value of a j-th stepped ramp signal, wherein j is a natural number being larger than 1, wherein the ramp signal generator comprises:
   a counter configured to generate a first counter signal which is used to generate the K first stepped ramp signals and a second counter signal which is used to generate the K second stepped ramp signals, and a ramp signal generation unit comprising a plurality of matching resistors comprising a first matching resistor and a second matching resistor, wherein the ramp signal generation unit is configured to store a final voltage value across the first matching resistor in response to the first counter signal and provide the stored final voltage value to the second matching resistor to derive the first stepped ramp signal from the second matching resistor and the ramp signal generation unit is configured to provide the stored final voltage value as an initial value of the second stepped ramp signal in response to the second signal; and an analog-to-digital converter configured to perform a correlated-double-sampling on the image signal to convert the image signal into a digital signal using the K first stepped ramp signals and the K second stepped ramp signals.

7. The apparatus of claim 6, wherein the ramp signal generation unit comprises:

a plurality of holders between the matching resistors, wherein the plurality of holders comprises a first holder that is configured to store the final voltage value across the first matching resistor and providing the final voltage value to the second matching resistor.

8. The apparatus of claim 7, wherein:

the plurality of matching resistors comprises a third marching resistor;

the plurality of holders comprises a second holder; and the second holder is configured to store a final voltage value across the second matching resistor and provide the final voltage value across the second matching resistor to the third matching resistor.

9. The apparatus of claim 7, wherein the first holder comprises:

a capacitive element configured to store the final voltage value across the previous matching resistor;

a switching element configured to perform a switching operation to cause the final voltage value across the first matching resistor to be stored in the capacitive element; and a buffer configured to provide the final voltage value stored in the capacitive element to the second matching resistor.

10. The apparatus of claim 6, wherein:

the ramp signal generation unit comprises four matching resistors; and the counter comprises an 8-bit current counter.

11. The apparatus of claim 6, wherein the ramp signal generator comprises:

a current mirror configured to provide a substantially identical current to the respective matching resistors of the ramp signal generation unit in response to the first counter signal and the second counter signal.

* * * * *